(12) United States Patent
Min et al.

(10) Patent No.: US 12,154,816 B2
(45) Date of Patent: Nov. 26, 2024

(54) MICRO-LED MANUFACTURING DEVICE

(71) Applicant: HARDRAM CO., LTD., Ansan-si (KR)

(72) Inventors: Sung Wook Min, Incheon (KR); Yeo Chan Yoon, Yongin-si (KR)

(73) Assignee: HARDRAM CO., LTD., Ansan-si (KR)

( * ) Notice: Subject to any disclaimer, the term of this patent is extended or adjusted under 35 U.S.C. 154(b) by 186 days.

(21) Appl. No.: 17/918,191

(22) PCT Filed: Feb. 24, 2021

(86) PCT No.: PCT/KR2021/002279
§ 371 (c)(1),
(2) Date: Oct. 11, 2022

(87) PCT Pub. No.: WO2021/215640
PCT Pub. Date: Oct. 28, 2021

(65) Prior Publication Data
US 2023/0125552 A1 Apr. 27, 2023

(30) Foreign Application Priority Data
Apr. 21, 2020 (KR) .................. 10-2020-0048210

(51) Int. Cl.
*B32B 43/00* (2006.01)
*H01L 21/683* (2006.01)

(52) U.S. Cl.
CPC ........ *H01L 21/6835* (2013.01); *B32B 43/006* (2013.01); *H01L 2221/68354* (2013.01);
(Continued)

(58) Field of Classification Search
CPC ............. B32B 43/006; Y10T 156/1158; Y10T 156/1917; H01L 21/6835; H01L 21/68742; H01L 21/68764; H01L 21/68785
See application file for complete search history.

(56) References Cited

U.S. PATENT DOCUMENTS 6,262,794 B1 * 7/2001 Miyajima ........... G03F 7/70358
355/75
8,517,363 B2 * 8/2013 Makino ................. H01L 21/682
269/73
(Continued)

FOREIGN PATENT DOCUMENTS

| KR | 10-2018-0115584 A | 10/2018 |
| KR | 10-2019-0109078 A | 9/2019 |
| KR | 10-2019-0114371 A | 10/2019 |

OTHER PUBLICATIONS

International Search Report for PCT/KR2021/002279 mailed Jun. 3, 2021 from Korean Intellectual Property Office.

*Primary Examiner* — Philip C Tucker
*Assistant Examiner* — Nickolas R Harm
(74) *Attorney, Agent, or Firm* — Paratus Law Group, PLLC

(57) ABSTRACT

A micro-LED manufacturing device includes: a wafer stage on which a wafer is positioned; a substrate stage on which a substrate is positioned; a lower base formed below the substrate stage; a first driving member formed on the substrate stage so as to move the wafer stage; and a second driving member formed on the lower base SO as to move the substrate stage. The micro-LED manufacturing device is formed such that the wafer stage moves over the substrate stage, and thus the substrate stage and the wafer stage can move synchronously with respect to the lower base.

7 Claims, 14 Drawing Sheets

(52) U.S. Cl.
CPC ............... *H01L 2221/68363* (2013.01); *H01L 2221/68381* (2013.01); *Y10T 156/1158* (2015.01); *Y10T 156/1917* (2015.01)

(56) References Cited

U.S. PATENT DOCUMENTS

| | | | |
|---|---|---|---|
| 10,096,740 B1* | 10/2018 | Chen | H01L 33/36 |
| 2016/0293566 A1 | 10/2016 | Golda et al. | |
| 2018/0053751 A1 | 2/2018 | Zou et al. | |
| 2018/0247855 A1* | 8/2018 | Takahashi | H01J 37/20 |
| 2020/0294976 A1* | 9/2020 | An | H01L 24/75 |

* cited by examiner (a)

(b)

MICRO-LED MANUFACTURING DEVICE

CROSS-REFERENCE TO PRIOR APPLICATIONS

This application is a National Stage Patent Application of PCT International Patent Application No. PCT/KR2021/002279 (filed on Feb. 24, 2021) under 35 U.S.C. § 371, which claims priority to Korean Patent Application No. 10-2020-0048210 (filed on Apr. 21, 2020), which are all hereby incorporated by reference in their entirety.

BACKGROUND

The present invention relates to a micro-LED manufacturing device, and more particularly, to a micro-LED manufacturing device having a structure in which a wafer stage and a substrate stage constituting the micro-LED manufacturing device can be moved integrally according to a working condition.

As the use of indication lights in electronic devices, numeric keypads of calculators, backlights of LED TVs, and various lighting devices increases, the demand for light emitting diodes has also increased.

A light emitting diode is a device referred to as an LED that injects holes and electrons by applying a voltage to a P-N junction diode in the forward direction (N type is positive, P type is negative), and emits energy generated by reunion of the holes and electrons as light, and as it has an advantage of high efficiency, long lifespan, and greatly reduced power consumption and maintenance cost, the light emitting diode attracts attention in the field of next-generation lighting equipment.

Generally, group III-V compound semiconductors such as gallium nitride (GaN), gallium phosphide (GaP), gallium arsenide (GaAs), and the like are used for manufacturing LEDs. As the group III-V compound semiconductors have excellent metal stability and a direct transition energy band structure, they attract much attention recently as a material for light emitting devices of visible light and the ultraviolet region.

The LED studied much recently as a global issue is spotlighted as a technique of developing micro-level LED chips with a light emitting area of 100×100 µm or less, rather than existing optical devices for large-area lamps of cm2 level.

However, as extremely small-sized micro-LED chips are developed, a transfer technique capable of directly transferring a device onto a substrate as is in an application stage is regarded as important in order to directly use the developed micro-LED chips.

The most necessary technique for using a micro-LED chip as a cell of a light source is a technique of transferring the micro-LED chip onto a transparent glass substrate, which is used as a display material.

Currently, in order to promptly transfer a micro-LED chip onto a transparent glass substrate while having high reliability, a micro-LED structure is grown on a wafer substrate, and then the LED structure is transferred onto the glass substrate using a Laser Lift-Off (LLO) technique.

Since this transfer technique should be carried out while maintaining the gap between the wafer substrate and the glass substrate within 100 micrometers, there is a problem in that defects occur as the wafer substrate and the glass substrate contact with each other due to a minute error through the process of individually moving the substrates.

SUMMARY

An object of the present invention is to provide a micro-LED manufacturing device having a structure that minimizes change in the gap between a wafer substrate and a glass substrate when the wafer substrate and the glass substrate move during a micro-LED chip transfer process.

To accomplish the above object, according to one aspect of the present invention, there is provided a micro-LED manufacturing device for transferring micro-LED chips of a wafer on a substrate by radiating laser light, the device comprising: a wafer stage on the bottom of which the wafer is positioned; a substrate stage on which the substrate is positioned; a lower base formed under the substrate stage; a first driving member formed on the substrate stage to move the wafer stage; and a second driving member formed on the lower base to move the substrate stage, wherein a structure for moving the wafer stage is formed on the substrate stage so that the substrate stage and the wafer stage move simultaneously in an integrated manner with respect to the lower base.

The wafer stage may include: a wafer stage lower plate moving in a first direction by the first driving member; a wafer stage upper plate moving in a second direction different from the first direction by a third driving member formed on the wafer stage lower plate; and a wafer adsorption unit formed downwards around a center hole formed on the wafer stage upper plate.

The substrate stage may include: a substrate stage lower plate moving in a third direction by the second driving member; a substrate stage middle plate moving in a fourth direction different from the third direction by a fourth driving member formed on the substrate stage lower plate; and a substrate stage upper plate formed to be raised and lowered on the top of the substrate stage middle plate.

First elevating units are formed at three points between the substrate stage middle plate and the substrate stage upper plate, and the first elevating unit may include a ball housing unit formed on the bottom surface of the substrate stage upper plate to have an empty spherical space, a cylinder unit having a ball formed to be inserted into the ball housing unit, and a hinge member formed on the bottom of the cylinder unit.

A first speed sensor for detecting a moving speed of the substrate stage lower plate may be formed on the substrate stage lower plate, and a first sensing member may be formed on the lower base at a position facing the first speed sensor.

A first guide member and a second guide member having a "⊏"-shaped cross-section are formed on the top surface of the lower base to face each other, and one side end of the lower substrate stage plate is inserted into the first guide member, and the other side end of the lower substrate stage lower plate is inserted into the second guide member.

A first level detection sensor and a second level detection sensor are formed on the substrate stage upper plate to determine whether the wafer stage lower plate is leveled by emitting ultrasonic waves to the wafer stage lower plate.

In order to detect foreign materials, the substrate stage upper plate may include a light generation unit formed on one side of a glass substrate, and a light reception unit formed on the other side of the glass substrate to receive light radiated from the light generation unit.

A first distance measuring sensor and a second distance measuring sensor for measuring whether the gap between a wafer adsorption unit and the glass substrate is uniform may be formed on the bottom of the wafer adsorption unit.

A first linear motor unit functioning as a second driving member may be formed on the lower base, and a first moving block that moves by the power received from the first linear motor unit may be formed on the substrate stage lower plate.

Second elevating units may be formed downwards around the wafer center hole of the wafer stage upper plate, and a wafer adsorption unit may be formed under the second elevating units.

A guide wire is formed on the lower base at one side of the second driving member, and a ring that encloses the guide wire is formed on the substrate stage lower plate.

As a structure that can move the substrate stage is formed on the lower base, and a structure for moving the wafer stage is formed on the substrate stage, the present invention has an effect of forming a structure capable of simultaneously moving the substrate stage and the wafer stage in an integrated manner with respect to the lower base, and forming a structure for moving only the wafer stage on the substrate stage while the substrate stage is fixed with respect to the lower base.

Accordingly, since the substrate stage and the wafer stage may move simultaneously in an integrated manner with respect to the lower base as a structure that can move the wafer stage is formed on the substrate stage, a structure that can move the substrate stage is formed on the lower base, and a structure that can move the wafer stage is formed on the upper base, and thus the present invention has an effect of solving the problem that the gap is not uniformly maintained when the substrate stage and the wafer stage move at the same time.

In addition, since a structure that can move the wafer stage is formed on the substrate stage, the present invention has an effect of easily maintaining the gap between the micro-LED chip and the glass substrate when the wafer stage moves on the substrate stage.

DETAILED DESCRIPTION

Hereinafter, the advantages and features of the present invention and a method for achieving them will become apparent with reference to the embodiments described below in detail together with the accompanying drawings. However, the present invention is not limited to the embodiments disclosed below, but will be implemented in a variety of different forms, and is provided to fully inform the scope of the present invention to those skilled in the art. In addition, when it is determined in the description of the present invention that related known techniques may obscure the gist of the present invention, detailed description thereof will be omitted.

Figure 1:
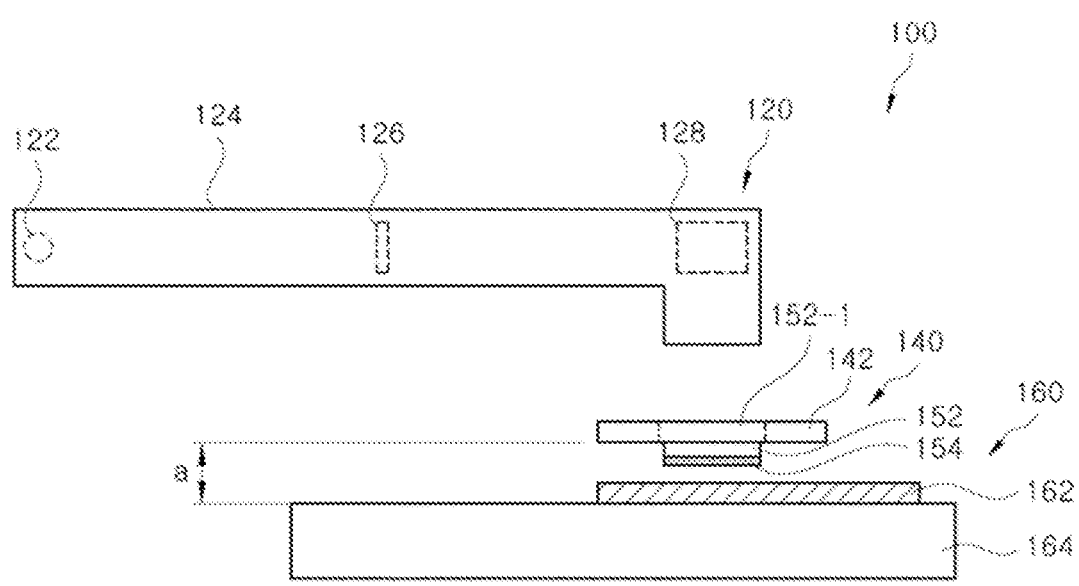
FIG. 1 is a side view schematically showing an important part of a micro-LED manufacturing device according to the present invention.
Figure 2:
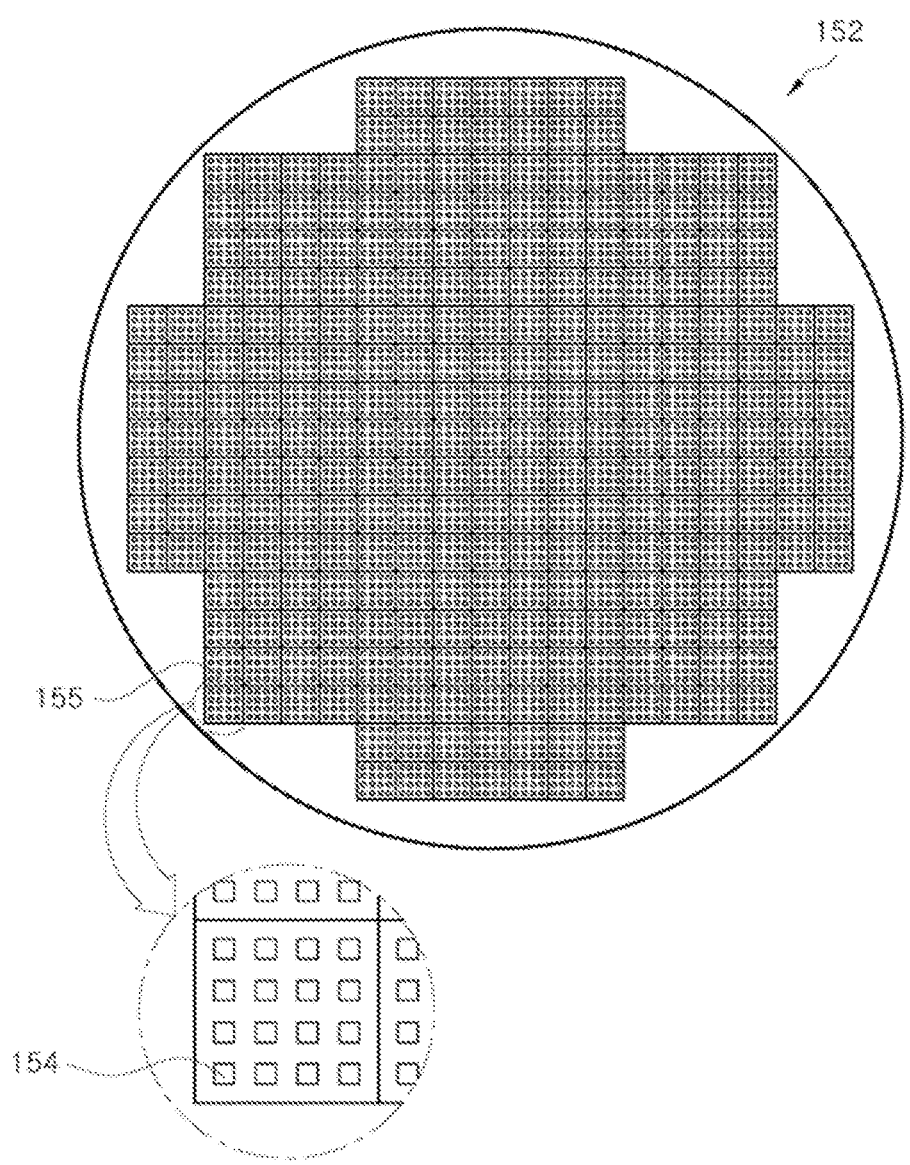
FIG. 2 is a front view schematically showing a wafer.

FIG. 1 is a side view schematically showing an important part of a micro-LED manufacturing device according to the present invention, and FIG. 2 is a front view schematically showing a wafer.

A micro-LED manufacturing device 100 according to the present invention includes a laser light source unit 120 for radiating laser light, a wafer unit 140 positioned under the laser light source unit 120 to receive the laser light radiated from the laser light source unit 120, and a glass substrate unit 160 positioned under the wafer unit 140, onto which a micro-LED chip 154 of the wafer unit 140 is transferred.

The laser light source unit 120 includes a laser light source 122 for generating laser light, a barrel unit 124 through which the laser light emitted from the laser light source 122 passes, a mask unit 126 that passes only part of the laser light in the middle of the barrel unit 124, and a scanner unit 128 for radiating the laser light passing through the mask unit 126 onto the wafer unit 140.

For the laser light generated from the laser light source 122, various types of lasers such as an excimer laser, a DPSS laser, and the like may be used according to bandgap energy. In this embodiment, an excimer laser having a wavelength of 157 to 350 nm may be used as a laser radiation module. In addition, the wavelength of the laser light output from the laser radiation module is preferably in the ultraviolet wavelength range.

The mask unit 126 allows only part of the laser light to pass through so that transfer may be performed only at a specific micro-LED chip 154 in the wafer unit 140.

The scanner unit 128 controls the path so that the laser light passing through the mask unit 126 is radiated onto a specific area of the wafer unit 140.

The wafer unit 154 includes a wafer stage 142 having a laser light transmitting unit 152-1 formed at the center so that the laser light may pass through, a wafer 152 vacuum-adsorbed on the bottom surface of the wafer stage 142, and a micro-LED chip 154 formed on the bottom surface of the wafer 152.

Micro-LED chips 154 are arranged on the wafer 152 in units of blocks 155, and one block 155 is configured of as many micro-LED chips 154 as a horizontal number x a vertical number.

In addition, the wafer 152 may be an R-wafer, a G-wafer, or a B-wafer, and in the present invention, an R-wafer is shown through FIG. 2. In the case of the R-wafer, a plurality of micro-Red-LED chips are formed, in the case of the G-wafer, a plurality of micro-Green-LED chips are formed, and in the case of the B-wafer, a plurality of micro-Blue-LED chips are formed.

The glass substrate unit 160 includes a glass substrate 162 formed under the micro-LED chip 154 to be spaced apart, and a substrate stage 164 on which the glass substrate 162 is vacuum-adsorbed.

The gap a between the bottom surface of the wafer stage 142 and the top surface of the substrate stage 164 is 100 micrometers or less, to be spaced apart by a very narrow distance.

Dropping the micro-LED chip 154 formed on the bottom surface of the wafer 152 onto the glass substrate 162 by the laser light emitted from the laser light source 122 is referred to as transfer (lift-off).

The laser light source unit 120 is in a fixed state, and the laser light passing through the scanner unit 128 is radiated only on a partial area of all the plurality of micro-LED chips 154 formed on the bottom surface of the wafer 152.

Accordingly, in order to transfer all the plurality of micro-LED chips 154 formed on the bottom surface of the wafer 152, a process of transferring some of the micro-LED chips 154, simultaneously moving the wafer stage 142 and the substrate stage 164 to the next transfer area, and then performing transfer by radiating laser light is repeated until all the plurality of micro-LED chips 154 are transferred.

The transfer process is described below in more detail.

Figure 3:
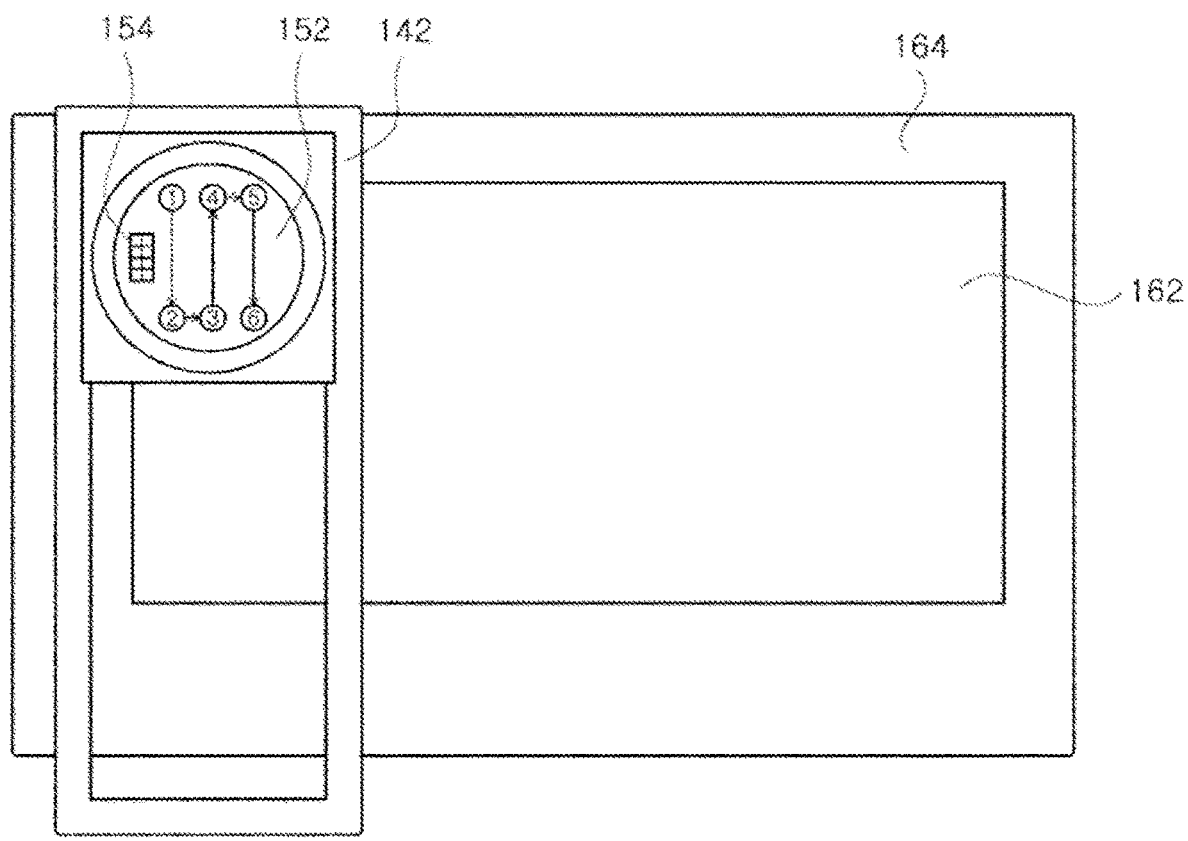
FIG. 3 is a first conceptual view showing a process of transferring a micro-LED chip.
Figure 4:
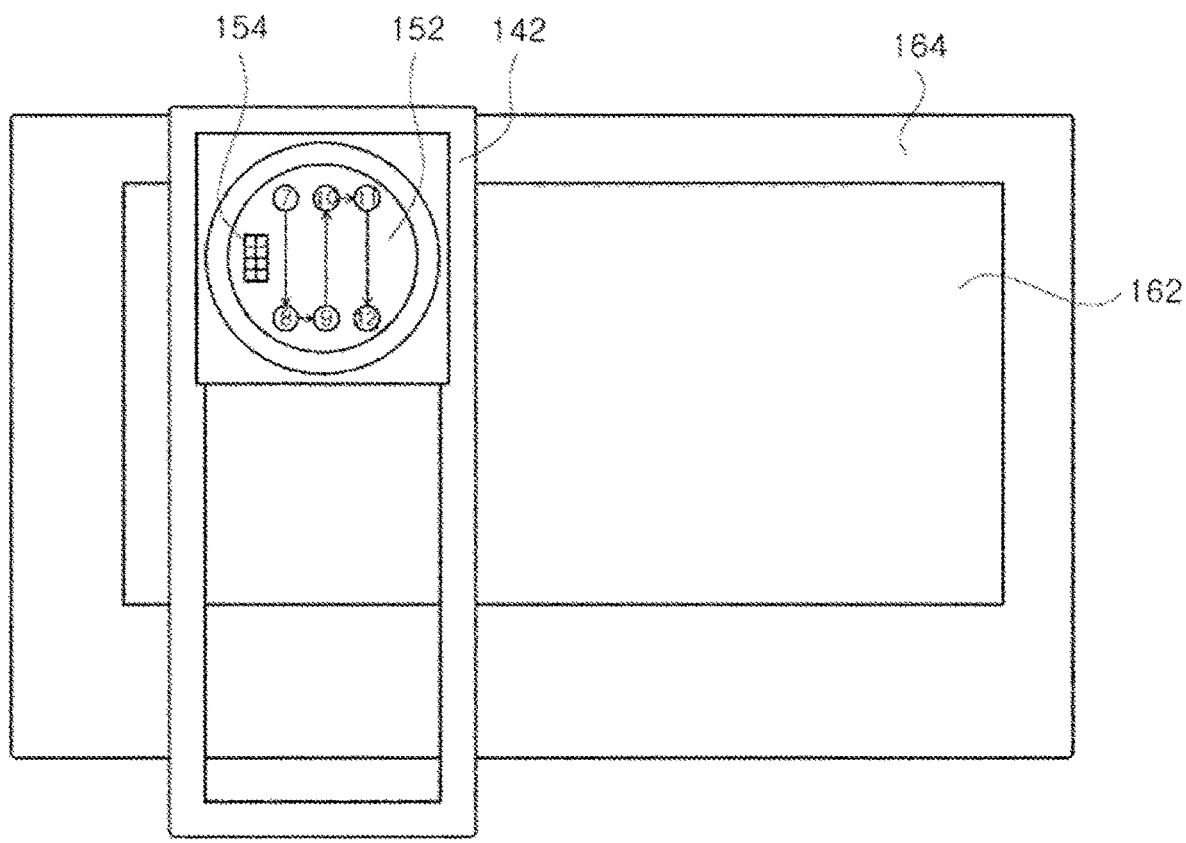
FIG. 4 is a second conceptual view showing a process of transferring a micro-LED chip.

FIG. 3 is a first conceptual view showing a process of transferring a micro-LED chip, and FIG. 4 is a second conceptual view showing a process of transferring a micro-LED chip.

The arrows shown in FIG. 3 are marked according to the order of radiating laser light. In practice, the laser light is radiated on an area of the same position in a fixed state, and transfer is carried out while the wafer stage 142 and the substrate stage 164 integrally move in a direction opposite to the direction of the arrows.

That is, transfer of the micro-LED chips 154 formed on the wafer 152 is performed in a first area 1 of the wafer 152 as shown in FIG. 3, and a second area 2 moves to the position of the first area 1 as the wafer stage 142 and the substrate stage 164 integrally move while the laser light is fixed at the position of the first area 1, and then transfer is conducted thereafter, and as the wafer stage 142 and the substrate stage 164 integrally move again, a third area 3 moves to the position of the first area 1 where the laser light is radiated, and transfer is continued. This process is performed in a fourth area 4, a fifth area 5, and a sixth area 6 in the same manner.

At this point, since all the micro-LED chips 154 formed on the wafer 152 are any one of three types of red, green, and blue chips, only the chips positioned at regular intervals among the chips in one area are transferred by the operation of the mask unit 126, rather than all the chips in one area are transferred on the glass substrate 162 at the same time.

When the transfer is completed up to the sixth area 6, only the wafer stage 142 moves from the position of FIG. 3 to the position of FIG. 4 while the substrate stage 164 is fixed.

Thereafter, in FIG. 4, in a way similar to the transfer process described with reference to FIG. 3, a seventh area 7 moves to the position of the first area 1 as the wafer stage 142 and the substrate stage 164 move integrally, and transfer is performed through laser light, and thereafter, an eighth area 8 moves to the position of the first area 1 as the wafer stage 142 and the substrate stage 164 move integrally, and transfer is performed through laser light, and thereafter, and this process is performed throughout a ninth area 9, a tenth area 10, an eleventh area 11, and a twelfth area 12.

Since the gap between the bottom surface of the wafer stage 142 and the top surface of the substrate stage 164 is as small as 100 micrometers or less in the transfer process, the gap between the micro-LED chip 154 positioned under the wafer stage 142 and the top surface of the glass substrate 162 is further smaller, and therefore, generation of defects, which occurs as the micro-LED chip 154 and the glass substrate 162 contact each other, should be prevented through the process of moving the stages while maintaining the small gap.

In the present invention, the formation structure of the wafer stage 142 and the substrate stage 164 will be described through the following description.

Figure 5:
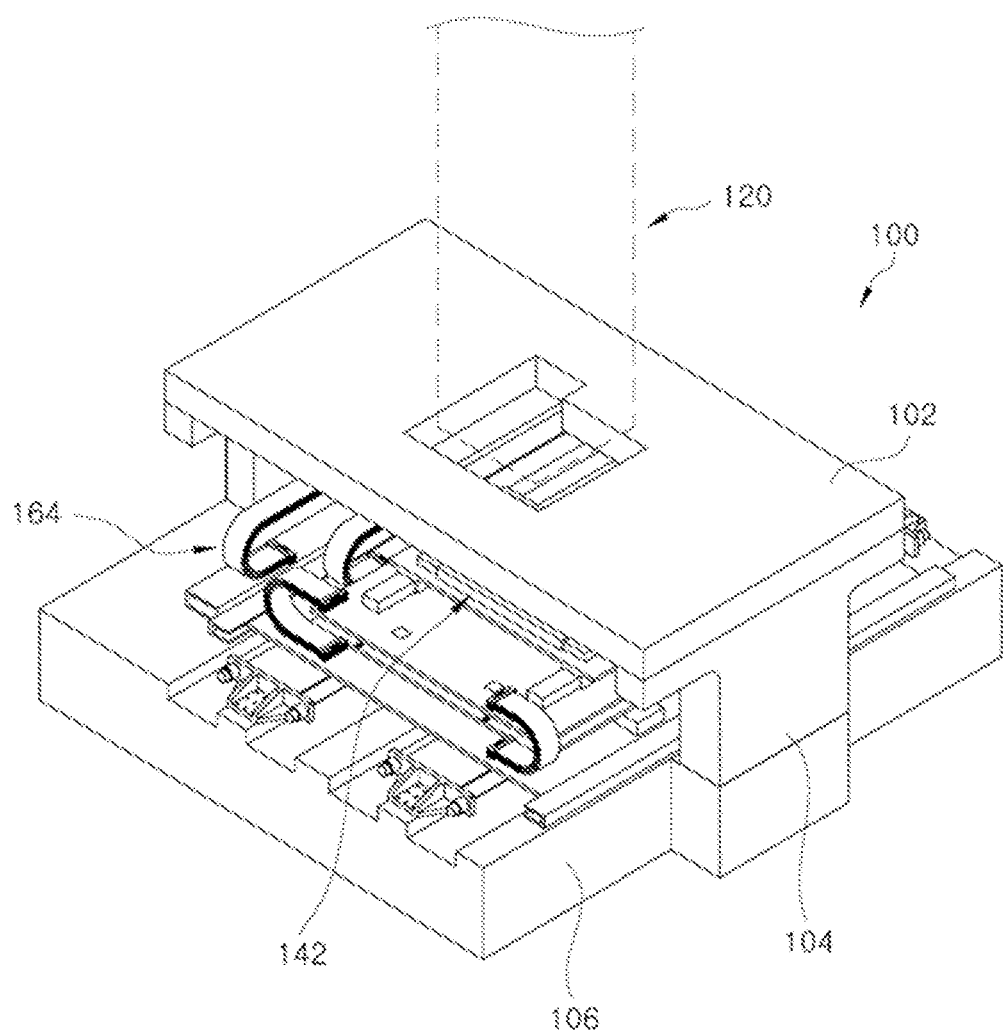
FIG. 5 is a perspective view schematically showing a part of a micro-LED manufacturing device according to the present invention.
Figure 6:
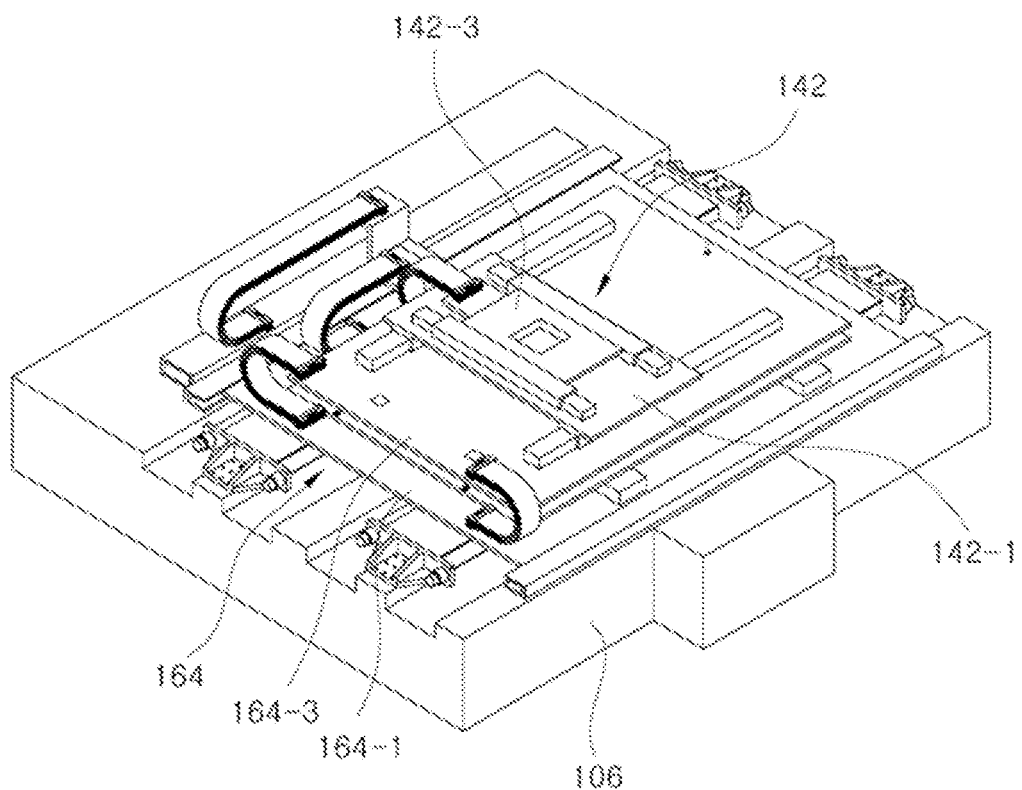
FIG. 6 is a perspective view schematically showing a state of omitting the upper base in FIG. 5.
Figure 7:
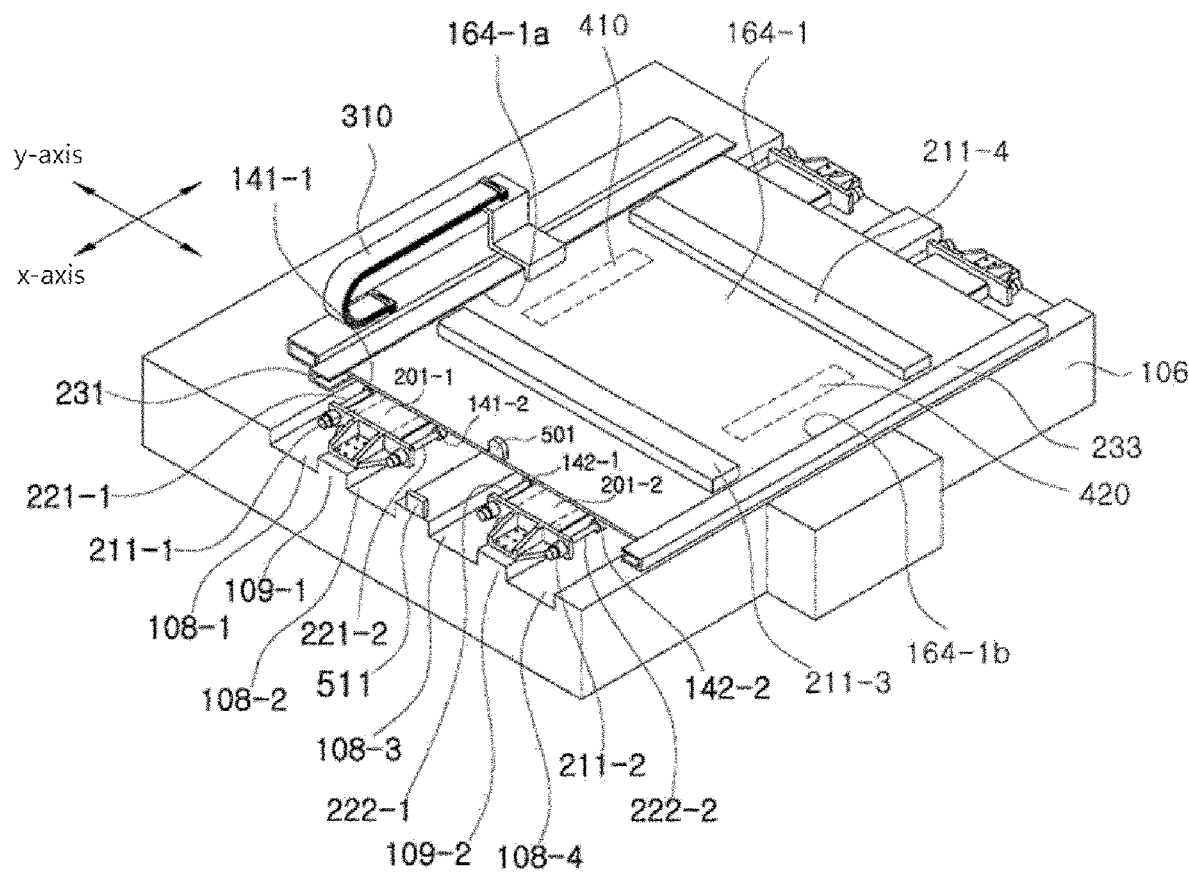
FIG. 7 is a perspective view schematically showing a state of forming a substrate stage lower plate on the lower base in FIG. 6.
Figure 8:
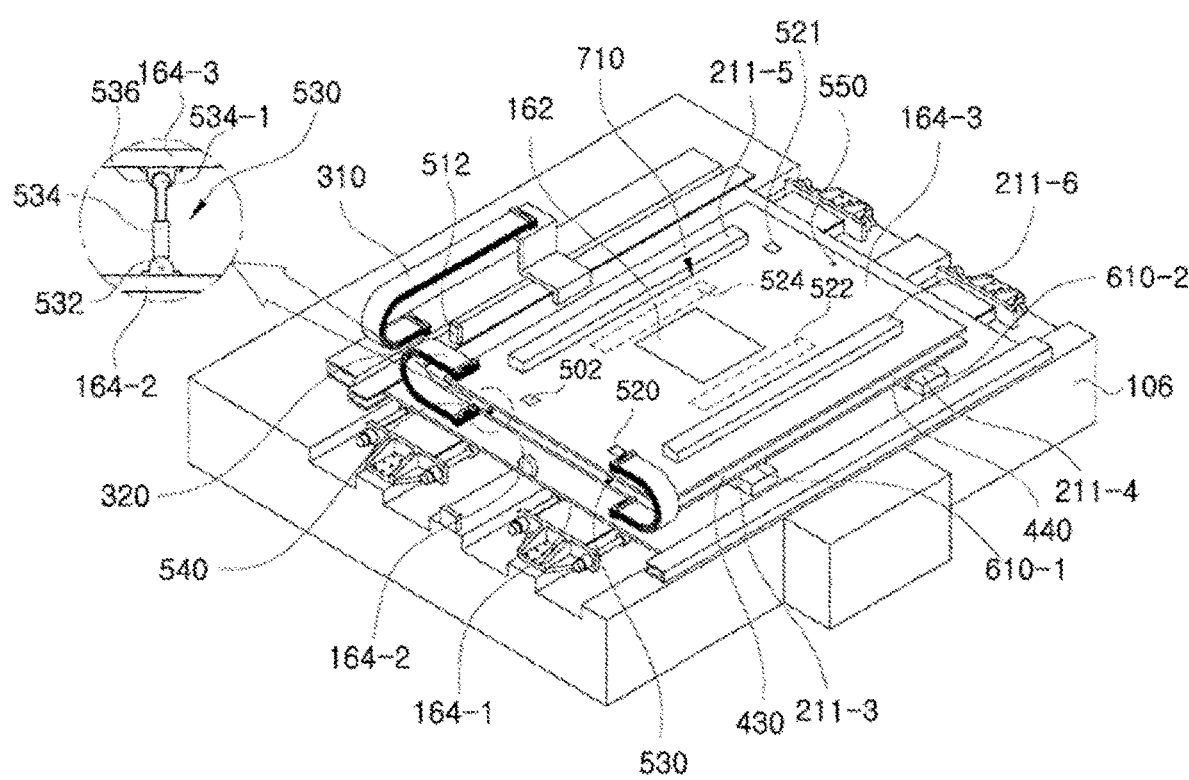
FIG. 8 is a perspective view schematically showing a state of forming a substrate stage middle plate and a substrate stage upper plate on the substrate stage lower plate in FIG. 7.

FIG. 5 is a perspective view schematically showing a part of a micro-LED manufacturing device according to the present invention, FIG. 6 is a perspective view schematically showing a state of omitting the upper base in FIG. 5, FIG. 7 is a perspective view schematically showing a state of forming a substrate stage lower plate on the lower base in FIG. 6, and FIG. 8 is a perspective view schematically showing a state of forming a substrate stage middle plate and a substrate stage upper plate on the substrate stage lower plate in FIG. 7.

The micro-LED manufacturing device 100 of the present invention includes, as shown in FIG. 5, an upper base 102 having a space in which the lower portion of the laser light source unit 120 is positioned, base pillars 104 positioned on both sides of the bottom surface of the upper base 102, a lower base 106 on which the lower portions of the base pillars 104 are positioned, and the substrate stage 164 and the wafer stage 142 formed in the space between the lower base 106 and the upper base 102.

In the present invention, as shown in FIG. 6, the micro-LED manufacturing device of the present invention includes a lower base 106, a substrate stage lower plate 164-1 positioned on the lower base 106, a substrate stage upper plate 164-3 positioned on the substrate stage lower plate 164-1, a wafer stage lower plate 142-1 positioned on the substrate stage upper plate 164-3, and a wafer stage upper plate 142-3 positioned on the wafer stage lower plate 142-1.

The structure in which the substrate stage lower plate 164-1 is positioned on the lower base 106 will be described with reference to FIG. 7.

In the present invention, the front-rear direction of the lower base 106 is defined as the x-axis direction, and the left-right direction of the lower base 106 is defined as the y-axis direction.

Four concave grooves 108-1, 108-2, 108-3, and 108-4 are formed on the lower base 106 in the front-rear direction at regular intervals, and a first linear motor unit 211-1 having a first linear motor 201-1, i.e., a driving member, located therein is formed on a first convex unit 109-1 formed between a first concave groove 108-1 and a second concave groove 108-2, and a second linear motor unit 211-2 having a second linear motor 201-2, i.e., a driving member, located therein is formed on a second convex unit 109-2 formed between a third concave groove 108-3 and a fourth concave groove 108-4.

A 1-1 guide wire 221-1 and a 1-2 guide wire 221-2 are formed on both sides of the first linear motor unit 211-1. In addition, a 2-1 guide wire 222-1 and a 2-2 guide wire 222-2 are formed on both sides of the second linear motor unit 211-2.

A first guide member 231 having a "⊏"-shaped cross-section is formed at one end of the top surface of the lower base 106 adjacent to the first concave groove 108-1 in the front-rear direction of the lower base 106, and a second guide member 233 having a "⊏"-shaped cross-section is formed at the other end of the top surface of the lower base 106 adjacent to the fourth concave groove 108-4 in a form facing the first guide member 231 in the front-rear direction of the lower base 106.

In addition, a first flexible wire cable duct 310 is formed at one end of the top surface of the lower base 106 to be adjacent to the first guide member 231, and the first flexible wire cable duct 310 is connected to the substrate stage lower plate 164-1.

The substrate stage lower plate 164-1 includes a first moving block 410 for receiving power of the first linear motor unit 211-1 and moving in the x-axis direction, and a second moving block 420 for receiving power of the second linear motor unit 211-2 and moving in the x-axis direction.

The first flexible wire cable duct 310 functions as a guide for connecting the wire transferred to the substrate stage lower plate 164-1 through the lower base 106 to the substrate stage lower plate 164-1 without hindering movement of the substrate stage lower plate 164-1.

The substrate stage lower plate 164-1 includes a 1-1 ring 141-1 enclosing the 1-1 guide wire 221-1, a 1-2 ring 141-2 enclosing the 1-2 guide wire 221-2, a 2-1 ring 142-1 enclosing the 2-1 guide wire 222-1, and a 2-2 ring 142-2 enclosing the 2-2 guide wire 222-2.

In addition, one side end 164-1a of the lower substrate stage plate 164-1 is inserted into the first guide member 231, and the other side end 164-1b of the lower substrate stage lower plate 164-1 is inserted into the second guide member 233.

When the first linear motor unit 211-1 and the second linear motor unit 211-2 operate, the substrate stage lower plate 164-1 moves in the x-axis direction.

A first speed sensor 501 for emitting ultrasonic waves is formed on the substrate stage lower plate 164-1, and a first sensing member 511 is formed on the lower base 106 at a position facing the first speed sensor 501.

The speed of the substrate stage lower plate 164-1 moving on the lower base 106 is measured by measuring the time of the ultrasonic wave emitted from the first speed sensor 501 and reflected and returned from the first sensing member 511.

A third linear motor unit 211-3, which is a driving member, is formed on the substrate stage lower plate 164-1 in the y-axis direction, and a fourth linear motor unit 211-4, which is a driving member, is formed to be adjacent to the third linear motor unit 211-3 in parallel.

Each of the third linear motor unit 211-3 and the fourth linear motor unit 211-4 includes a linear motor formed therein, and its external shape is a rectangular block shape formed long in the y-axis direction.

As shown in FIG. 8, the substrate stage middle plate 164-2 is formed on the substrate stage lower plate 164-1, and the substrate stage upper plate 164-3 is formed on the substrate stage middle plate 164-2.

A first substrate concave groove 610-1 of a form enclosing the third linear motor unit 211-3, and a second substrate concave groove 610-2 of a form enclosing the fourth linear motor unit 211-4 are formed under the substrate stage middle plate 164-2.

The first substrate concave groove 610-1 and the second substrate concave groove 610-2 are formed in parallel to each other.

In addition, a third moving block 430 that moves by the power received from the third linear motor unit 211-3 is formed on the first substrate concave groove 610-1 of the substrate stage middle plate 164-2, and a fourth moving block 440 that moves by the power received from the fourth linear motor unit 211-4 is formed on the second substrate concave groove 610-2 of the substrate stage middle plate 164-2.

When the third linear motor unit 211-3 and the fourth linear motor unit 211-4 operate, the substrate stage middle plate 164-2 moves in the y-axis direction.

A second flexible wire cable duct 320 is formed on the substrate stage lower plate 164-1, and the second flexible wire cable duct 320 is connected to the substrate stage upper plate 164-3.

A second speed sensor 502 for detecting the speed of the substrate stage upper plate 164-3 moving in the y-axis direction is formed on the top surface of the substrate stage upper plate 164-3, and a second sensing member 512 is formed on the lower base 106 at a position facing the second speed sensor 502.

The speed of the substrate stage upper plate 164-3 moving on the lower base 106 is measured by measuring the time of the ultrasonic wave emitted from the second speed sensor 502 and reflected and returned from the second sensing member 512.

A first level detection sensor 520 and a second level detection sensor 521 for generating ultrasonic waves upward are formed on the top surface of the substrate stage upper plate 164-3.

The first level detection sensor 520 and the second level detection sensor 521 determine that the bottom surface of the wafer stage lower plate 142-1 is leveled when the times of the ultrasonic waves reflected from the bottom surface of the wafer stage lower plate 142-1 match, and determine that the bottom surface of the wafer stage lower plate 142-1 is not leveled when the times of the ultrasonic waves reflected from the bottom surface of the wafer stage lower plate 142-1 mismatch.

In order to detect foreign materials generated in the gap between the glass substrate 162 positioned on the top surface of the substrate stage upper plate 164-3 and the wafer 152, a light generation unit 522 is formed on one side of the glass substrate 162, and a light receiving unit 524 for receiving light radiated from the light generation unit 522 is formed on the other side of the glass substrate 162.

In the case where there is a foreign material between the glass substrate 162 and the wafer 152 when the light receiving unit 524 receives the light radiated from the light generation unit 522, intensity of light received in the area where the foreign material is located is low compared to those of the other areas, and presence of the foreign material can be detected.

First elevating units 530, 540, and 550 are formed at three points between the bottom of the substrate stage upper plate 164-3 and the top of the substrate stage middle plate 164-2.

The 1-1 elevating unit 530 includes a ball housing unit 536 formed on the bottom surface of the substrate stage upper plate 164-3 to have an empty spherical space, a cylinder unit 534 having a ball 534-1 formed to be inserted into the ball housing unit 536, and a hinge member 532 formed on the bottom of the cylinder unit 534.

The cylinder unit 534 is extendable. In addition, the ball 534-1 may rotate inside the ball housing unit 536.

The hinge member 532 is fixed on the top surface of the substrate stage middle plate 164-2.

Figure 9:
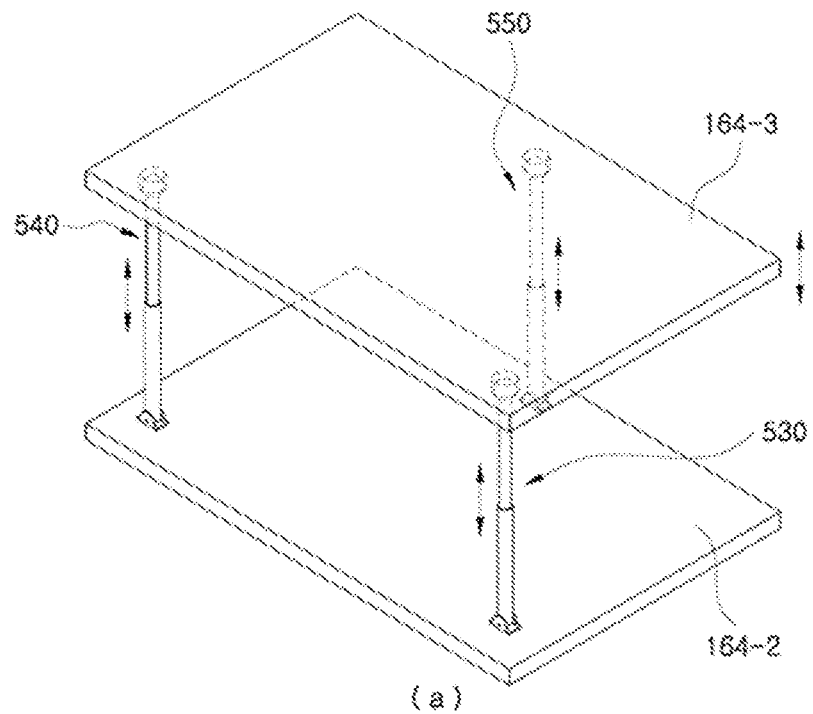
In FIG. 9, (a) is a perspective view schematically showing a case in which the substrate stage upper plate is raised and lowered by a first elevating unit, and in FIG. 9, (b) is a perspective view schematically showing a case in which the substrate stage upper plate is inclined by the first elevating unit.
Figure 9:
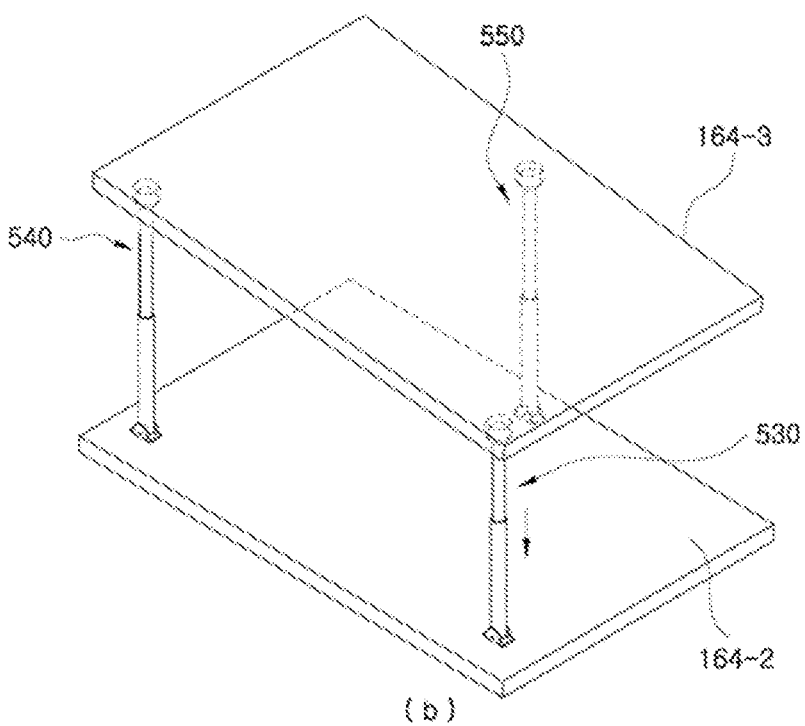

FIG. 9(a) is a perspective view schematically showing a case in which the substrate stage upper plate is raised and lowered by a first elevating unit, and FIG. 9(b) is a perspective view schematically showing a case in which the substrate stage upper plate is inclined by the first elevating unit.

As shown in FIG. 9(a), the first elevating units 530, 540, and 550 are formed at three points so that when all the three first elevating units 530, 540, 550 are raised and lowered at an equal height, the substrate stage upper plate 164-3 is raised and lowered with respect to the substrate stage middle plate 164-2.

In addition, when only the 1-1 elevating unit 530 among the first elevating units 530, 540, and 550 is lowered as shown in FIG. 9(b), the substrate stage upper plate 164-3 is tilted down toward the position where the 1-1 elevating unit 530 is positioned.

In the present invention, the substrate stage upper plate 164-3 may be raised and lowered or tilted through the configuration as described above.

A substrate area unit 710 in which the glass substrate 162 is positioned is formed at the top center of the substrate stage upper plate 164-3, and a fifth linear motor unit 211-5 and a sixth linear motor unit 211-6, i.e., driving members, are formed on both sides of the substrate area unit 710 in the x-axis direction.

Figure 10:
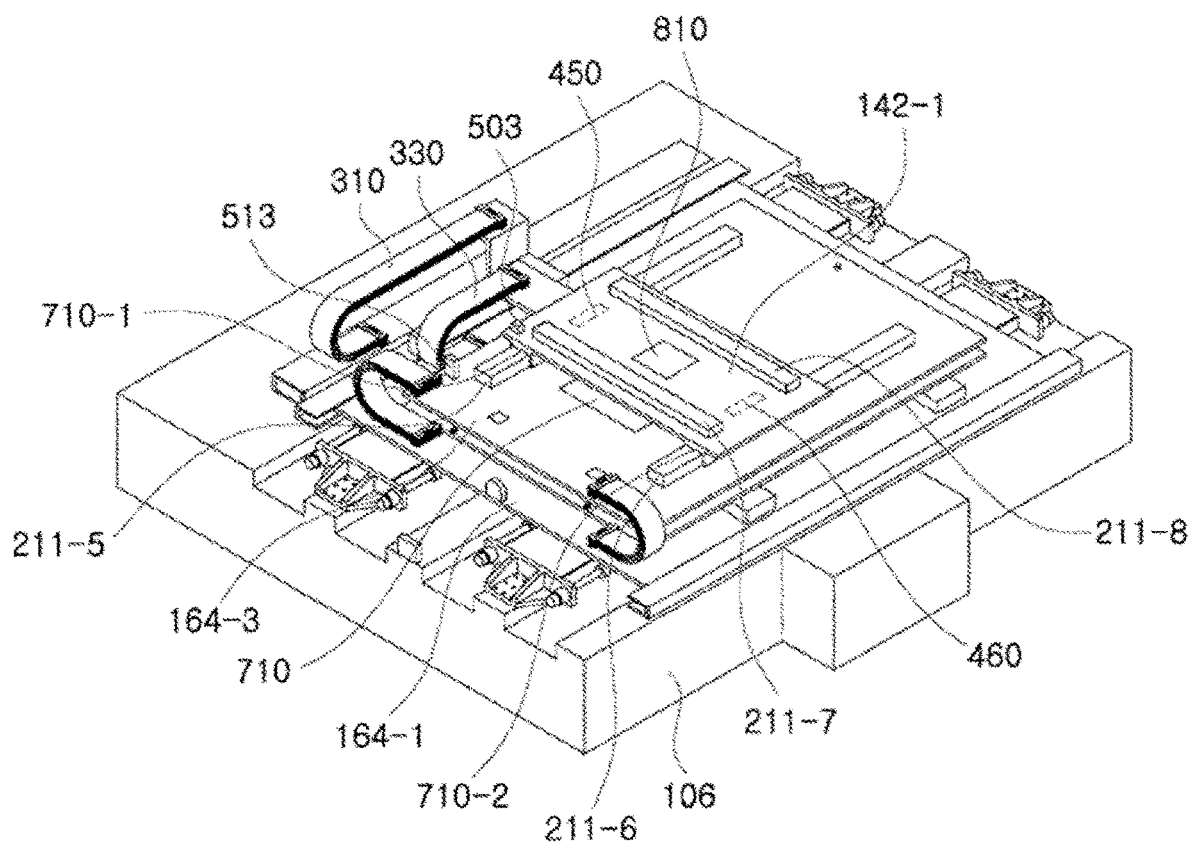
FIG. 10 is a perspective view schematically showing a state in which a wafer stage lower plate is formed on the substrate stage upper plate in FIG. 8.
Figure 11:
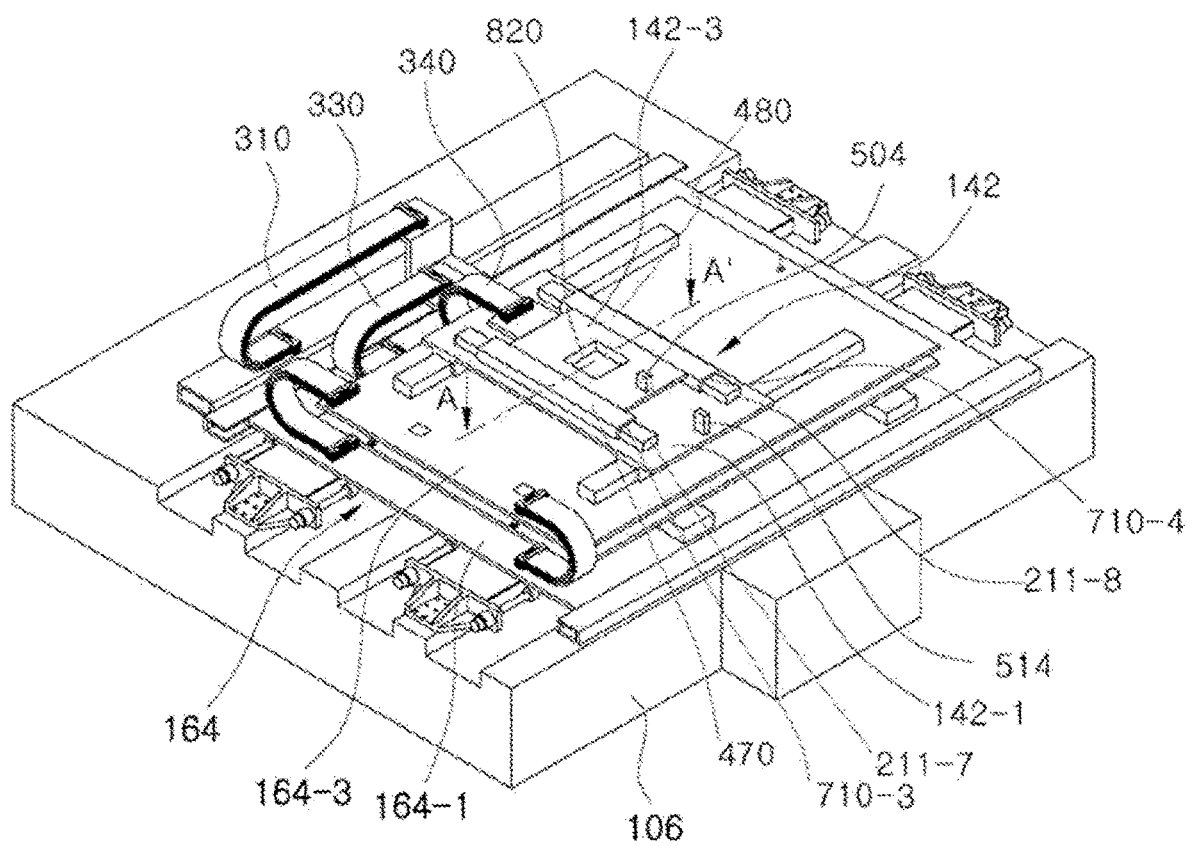
FIG. 11 is a perspective view schematically showing a state in which a wafer stage upper plate is formed on the wafer stage lower plate in FIG. 10.

FIG. 10 is a perspective view schematically showing a state in which a wafer stage lower plate is formed on the substrate stage upper plate in FIG. 8, and FIG. 11 is a perspective view schematically showing a state in which a wafer stage upper plate is formed on the wafer stage lower plate in FIG. 10.

In the present invention, a third flexible wire cable duct 330 is formed on the substrate stage upper plate 164-3 as shown in FIG. 10, and the third flexible wire cable duct 330 is connected to the wafer stage lower plate 142-1.

A first wafer concave groove 710-1 enclosing the fifth linear motor unit 211-5 and a second wafer concave groove 710-2 enclosing the sixth linear motor unit 211-6 are formed on the bottom of the wafer stage lower plate 142-1.

Then, the wafer stage lower plate 142-1 includes a fifth moving block 450 formed on the first wafer concave groove 710-1 to be driven by the fifth linear motor unit 211-5, and a sixth moving block 460 formed on the second wafer concave groove 710-2 to be driven by the sixth linear motor unit 211-6.

When the fifth linear motor unit 211-5 and the sixth linear motor unit 211-6 operate, the wafer stage lower plate 142-1 moves in the x-axis direction.

A third speed sensor 503 for generating ultrasonic waves is formed on the wafer stage lower plate 142-1, and a third sensing member 513 for reflecting the ultrasonic waves generated by the third speed sensor 503 is provided on the top surface of the substrate stage upper plate 164-3.

When the wafer stage lower plate 142-1 moves in the x-axis direction, the third speed sensor 503 and the third sensing member 513 may measure the moving speed of the wafer stage lower plate 142-1.

Then, a first wafer center hole 810 is formed at the center of the wafer stage lower plate 142-1, and a seventh linear motor unit 211-7 and an eighth linear motor unit 211-8, which are driving members formed in the y-axis direction, are formed on both sides of the first wafer center hole 810.

As shown in FIG. 11, a fourth flexible wire cable duct 340 is formed on the wafer stage lower plate 142-1, and the fourth flexible wire cable duct 340 is connected to the wafer stage upper plate 142-3.

A third wafer concave groove 710-3 enclosing the seventh linear motor unit 211-7, and a fourth wafer concave groove 710-4 enclosing the eighth linear motor unit 211-8 are formed on the wafer stage upper plate 142-3.

The wafer stage upper plate 142-3 includes a seventh moving block 470 formed on the third wafer concave groove 710-3 to be driven by the seventh linear motor unit 211-7, and an eighth moving block 480 formed on the fourth wafer concave groove 710-4 to be driven by the eighth linear motor unit 211-8.

When the seventh linear motor unit 211-7 and the eighth linear motor unit 211-8 operate, the wafer stage upper plate 142-3 moves in the y-axis direction.

A fourth speed sensor 504 for generating ultrasonic waves is formed on the wafer stage upper plate 142-3, and a fourth sensing member 514 for reflecting the ultrasonic waves generated by the fourth speed sensor 504 is formed on the wafer stage lower plate 142-1.

The speed of the wafer stage upper plate 142-3 moving in the y-axis direction may be measured through the fourth speed sensor 504 and the fourth sensing member 514.

A second wafer center hole 820 is formed at the center of the wafer stage upper plate 142-3.

Figure 12:
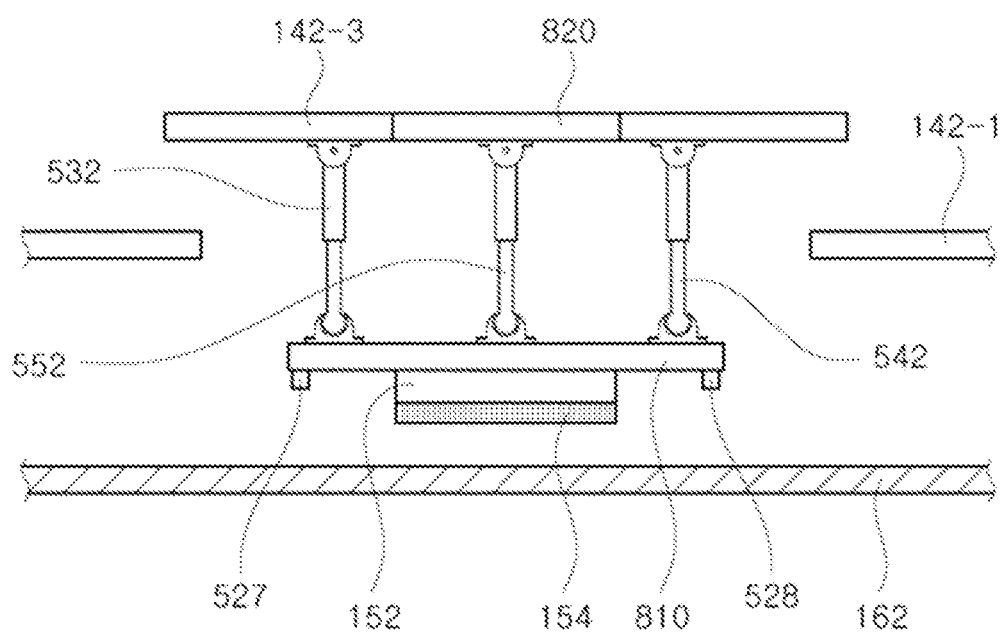
FIG. 12 is a schematic cross-sectional view taken along the line A-A' of the wafer stage upper plate.

FIG. 12 is a schematic cross-sectional view taken along the line A-A' of the wafer stage upper plate.

Second elevating units 532, 542, and 552 are formed downwards around the second wafer center hole 820 of the wafer stage upper plate 142-3, and a wafer adsorption unit 810 is formed under the second elevating units 532, 542, and 552. The wafer 152 is tightly attached on the bottom of the wafer adsorption unit 810, and micro-LED chips 154 are formed on the bottom surface of the wafer 152.

The second elevating units 532, 542, and 552 are formed at three points between the wafer stage upper plate 142-3 and the wafer adsorption unit 810, and as the shape is similar to that of the first elevating unit 530, detailed description thereof will be omitted.

A first distance measuring sensor 527 and a second distance measuring sensor 528 using ultrasonic waves are formed on the bottom surface of the wafer adsorption unit 810.

The first distance measuring sensor 527 and the second distance measuring sensor 528 emit ultrasonic waves toward the glass substrate 162 positioned below while being spaced apart to face each other around the wafer 152, and determines whether the gap between the wafer adsorption unit 810 and the glass substrate 162 is uniform by measuring the arrival times of the reflected ultrasonic waves.

As the present invention may grasp whether the gap between the wafer adsorption unit 810 and the glass substrate 162 is uniformly maintained through the first distance measuring sensor 527 and the second distance measuring sensor 528, precision is improved.

Figure 13:
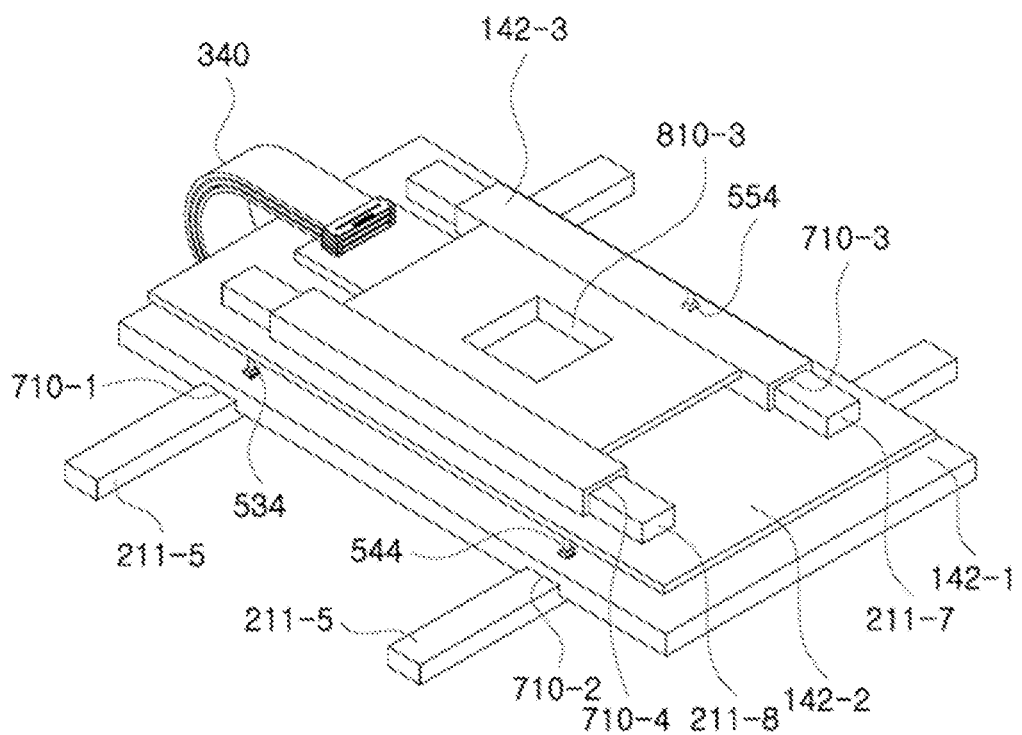
FIG. 13 is a partial perspective view schematically showing a modified example of FIG. 11.

FIG. 13 is a partial perspective view schematically showing a modified example of FIG. 11.

FIG. 13 is a view showing a case of forming a wafer stage middle plate 142-2 between the wafer stage lower plate 142-1 and the wafer stage upper plate 142-3.

A first wafer concave groove 710-1 enclosing the fifth linear motor unit 211-5 and a second wafer concave groove 710-2 enclosing the sixth linear motor unit 211-6 are formed on the bottom of the wafer stage lower plate 142-1.

Third elevating units 534, 544, and 554 are formed at three points between the wafer stage lower plate 142-1 and the wafer stage middle plate 142-2.

Since the structure of the third elevating units 534, 544, and 554 are similar to that of the second elevating units 532, 542, and 552, detailed description thereof will be omitted.

The wafer stage middle plate 142-2 may be raised and lowered, or tilted with respect to the wafer stage lower plate 142-1 by the third elevating units 534, 544, and 554.

In addition, a seventh linear motor unit 211-7 and an eighth linear motor unit 211-8 are formed on the wafer stage middle plate 142-2 in the y-axis direction.

A fourth flexible wire cable duct 340 is formed on the wafer stage lower plate 142-1, and the fourth flexible wire cable duct 340 is connected to the wafer stage upper plate 142-3.

A third wafer concave groove 710-3 enclosing the seventh linear motor unit 211-7, and a fourth wafer concave groove 710-4 enclosing the eighth linear motor unit 211-8 are formed on the wafer stage upper plate 142-3.

A 3-1 wafer center hole 810-3 is formed at the center of the wafer stage upper plate 142-3.

Figure 14:
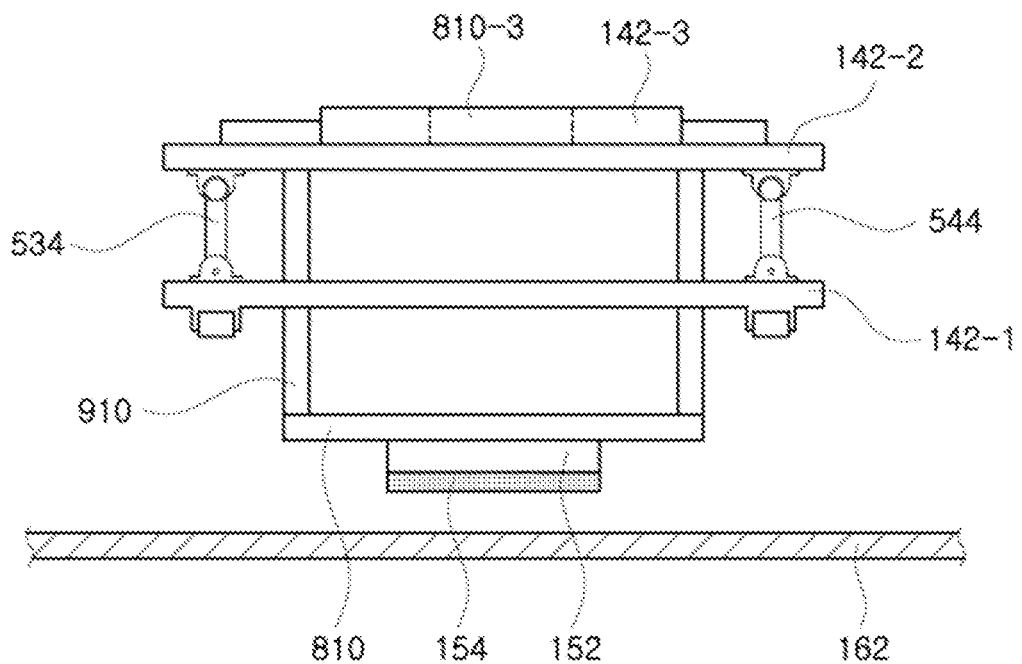
FIG. 14 is a side view schematically showing around a 3-1 wafer center hole in FIG. 13.

FIG. 14 is a side view schematically showing around the 3-1 wafer center hole in FIG. 13.

In the present invention, when the elevating units are formed between the wafer stage lower plate 142-1 and the wafer stage middle plate 142-2 as shown in FIG. 14, a plurality of supporting rods 910 is formed downwards around the 3-1 wafer center hole 810-3 of the wafer stage upper plate 142-3, and a wafer adsorption unit 810 is formed on the bottom of the supporting rods 910, and then a wafer 152 is tightly attached on the bottom surface of the wafer adsorption unit 810, and micro-LED chips 154 are formed on the wafer 152.

As a structure that can move the substrate stage 164 is formed on the lower base 106, and a structure for moving the wafer stage 142 is formed on the substrate stage 164, the present invention has an effect of forming a structure capable of simultaneously moving the substrate stage 164 and the wafer stage 142 in an integrated manner with respect to the lower base 106, and forming a structure for moving only the wafer stage 142 on the substrate stage 164 while the substrate stage 164 is fixed with respect to the lower base 106.

Accordingly, since the substrate stage 164 and the wafer stage 142 may move simultaneously in an integrated manner with respect to the lower base 106 as a structure that can move the wafer stage 142 is formed on the substrate stage 164, a structure that can move the substrate stage 164 is formed on the lower base 106, and a structure that can move the wafer stage 142 is formed on the upper base 102, and thus the present invention has an effect of solving the problem that the gap is not uniformly maintained when the substrate stage 164 and the wafer stage 142 move at the same time.

Since a structure that can move the wafer stage 142 is formed on the substrate stage 164, the present invention has an effect of easily maintaining the gap between the micro-LED chip 154 and the glass substrate 160 when the wafer stage 142 moves on the substrate stage 164.

The embodiments in the description of the present invention described above are presented by selecting the most preferred examples from various possible examples to help understanding of those skilled in the art, and the technical spirit of this present invention is not necessarily limited or restricted only by these embodiments, and various changes and modifications and equivalent other embodiments are possible without departing from the technical spirit of the present invention.

DESCRIPTION OF SYMBOLS

100: Micro-LED manufacturing device 106: Lower base
108-1: First concave groove 120: Laser light source unit
122: Laser light source 124: Barrel unit
126: Mask unit 128: Scanner unit
140: Wafer unit 152: Wafer
154: Micro-LED chip 160: Glass substrate unit
211-1: First linear motor unit 231: First guide member
310: First flexible wire cable duct 530, 540, 550: First elevating unit

The invention claimed is:

1. A micro-LED manufacturing device for transferring micro-LED chips of a wafer on a substrate by radiating laser light, the device comprising:
   a wafer stage on the bottom of which the wafer is positioned;
   a substrate stage on which the substrate is positioned;
   a lower base formed under the substrate stage;
   a first driving member formed on the substrate stage to move the wafer stage; and
   a second driving member formed on the lower base to move the substrate stage, wherein
   a structure for moving the wafer stage is formed on the substrate stage so that the substrate stage and the wafer stage may move simultaneously in an integrated manner with respect to the lower base.

2. The device according to claim 1, wherein the wafer stage includes:
   a wafer stage lower plate moving in a first direction by the first driving member;
   a wafer stage upper plate moving in a second direction different from the first direction by a third driving member formed on the wafer stage lower plate; and
   a wafer adsorption unit formed downwards around a center hole formed on the wafer stage upper plate.

3. The device according to claim 1, wherein the substrate stage includes:
   a substrate stage lower plate moving in a third direction by the second driving member;
   a substrate stage middle plate moving in a fourth direction different from the third direction by a fourth driving member formed on the substrate stage lower plate; and
   a substrate stage upper plate formed to be raised and lowered on the top of the substrate stage middle plate.

4. The device according to claim 3, wherein first elevating units are formed at three points between the substrate stage middle plate and the substrate stage upper plate.

5. The device according to claim 4, wherein a first speed sensor for detecting a moving speed of the substrate stage lower plate is formed on the substrate stage lower plate, and a first reflecting plate, which reflects a first ultrasonic wave emitted from the first speed sensor, is formed on the lower base at a position facing the first speed sensor.

6. The device according to claim 5, wherein a first guide member and a second guide member each having an insertion groove are formed on a top surface of the lower base to face each other, and one side end of the substrate stage lower plate is inserted into the insertion groove of the first guide member, and another side end of the substrate stage lower plate is inserted into the insertion groove of the second guide member.

7. The device according to claim 6, wherein a first level detection sensor and a second level detection sensor are formed on the substrate stage upper plate to determine whether the wafer stage lower plate is leveled by emitting ultrasonic waves to the wafer stage lower plate.

\* \* \* \* \*